(12) United States Patent
Madsen et al.

(10) Patent No.: US 10,382,010 B2
(45) Date of Patent: Aug. 13, 2019

(54) ATTENUATION CIRCUIT AND METHOD OF CONTROLLING AN ATTENUATION CIRCUIT

(71) Applicant: Anokiwave, Inc., San Diego, CA (US)

(72) Inventors: Kristian N. Madsen, Napa, CA (US); Robert J. McMorrow, Concord, MA (US)

(73) Assignee: Anokiwave, Inc., San Diego, CA (US)

( * ) Notice: Subject to any disclaimer, the term of this patent is extended or adjusted under 35 U.S.C. 154(b) by 0 days.

(21) Appl. No.: 15/475,246

(22) Filed: Mar. 31, 2017

(65) Prior Publication Data

US 2018/0287589 A1  Oct. 4, 2018

(51) Int. Cl.
*H03K 5/08* (2006.01)
*H03H 11/24* (2006.01)

(52) U.S. Cl.
CPC .................. *H03H 11/245* (2013.01)

(58) Field of Classification Search
CPC .................................................. H03H 11/245
USPC ........................................................ 327/308
See application file for complete search history.

(56) References Cited

U.S. PATENT DOCUMENTS

| | | | |
|---|---|---|---|
| 5,281,928 A * | 1/1994 | Ravid | H03H 11/245 327/308 |
| 5,448,207 A * | 9/1995 | Kohama | H03H 11/245 327/308 |
| 5,448,250 A | 9/1995 | Day | |
| 5,563,557 A * | 10/1996 | Sasaki | H03H 11/245 327/328 |
| 5,724,666 A | 3/1998 | Dent | |
| 7,087,993 B2 | 8/2006 | Lee | |
| 7,129,568 B2 | 10/2006 | Lee et al. | |
| 7,148,720 B2 * | 12/2006 | Chen | H03H 11/30 326/30 |
| 7,205,817 B1 * | 4/2007 | Huang | H03H 11/245 327/308 |

(Continued)

FOREIGN PATENT DOCUMENTS

WO   WO 2017/078851 A2   5/2017

OTHER PUBLICATIONS

Bailey, General Layout Guidelines for RF and Mixed-Signal PCBs, Maxim Integrated, Tutorial 5100, 10 pages, Sep. 14, 2011.

(Continued)

*Primary Examiner* — Ryan Jager
(74) *Attorney, Agent, or Firm* — Nutter McClennen & Fish LLP

(57) ABSTRACT

A circuit for attenuating a signal has an input configured to receive an input signal, an output configured to transmit an output signal, a first attenuation path (having a first active circuit device) between the input and the output, and a second attenuation path between the input and the output. The circuit also has an operational amplifier that, like most operational amplifiers, has a first op-amp input, a second op-amp input, and an op-amp output. In addition, the circuit has a voltage control device coupled with the first op-amp input, and a second active circuit device having a first active terminal coupled with the second op-amp input. A feedback loop is coupled between the op-amp output and a second active terminal of the second active circuit device. Moreover, the op-amp output also is coupled with the first active circuit device.

19 Claims, 12 Drawing Sheets

(56) References Cited

U.S. PATENT DOCUMENTS

| | | | |
|---|---|---|---|
| 7,663,420 B2* | 2/2010 | Araki | H01L 27/0802 327/108 |
| 7,750,738 B2* | 7/2010 | Bach | H03G 1/007 330/277 |
| 7,889,006 B1* | 2/2011 | Jones | H03F 3/45098 330/254 |
| 8,558,398 B1 | 10/2013 | Seetharam | |
| 8,674,746 B1* | 3/2014 | Staudinger | H03H 7/25 327/333 |
| 8,866,283 B2 | 10/2014 | Chen et al. | |
| 9,787,286 B2* | 10/2017 | Sharma | H03H 11/245 |
| 2003/0076148 A1* | 4/2003 | Tamiya | H03G 1/007 327/308 |
| 2005/0017352 A1 | 1/2005 | Lee | |
| 2005/0082645 A1 | 4/2005 | Lee et al. | |
| 2005/0098860 A1 | 5/2005 | Lai et al. | |
| 2006/0006505 A1 | 1/2006 | Chiang et al. | |
| 2006/0186944 A1* | 8/2006 | Chan | H03G 1/007 327/350 |
| 2008/0048751 A1* | 2/2008 | Koen | H03G 1/007 327/308 |
| 2009/0256752 A1 | 10/2009 | Akkermans et al. | |
| 2011/0198742 A1 | 8/2011 | Danno et al. | |
| 2012/0313219 A1 | 12/2012 | Chen et al. | |
| 2013/0050055 A1 | 2/2013 | Paradiso et al. | |
| 2013/0187830 A1 | 7/2013 | Warnick et al. | |
| 2014/0348035 A1 | 11/2014 | Corman et al. | |
| 2016/0248157 A1 | 8/2016 | Rao et al. | |
| 2017/0302254 A1* | 10/2017 | McNamara | H03H 7/06 |

OTHER PUBLICATIONS

Ismail, Introduction to RF CMOS IC Design for Wireless Applications, Analog VLSI Lab, The Ohio State University, 117 pages, undated.

Jain, Layout Review Techniques for Low Power RF Designs, Application Note AN098, Texas Instruments, 14 pages, 2012.

Maxim, 5GHz, 4-Channel MIMO Transmitter, MAX2850, Maxim Integrated Products, Inc., 33 pages, 2010.

Silicon Labs, Layout Design Guide for the Si4455/435x RF ICs, AN685, Silicon Laboratories, 22 pages, 2014.

International Searching Authority, International Search Report—International Application No. PCT/US18/25423, dated May 8, 2018, together with the Written Opinion of the International Searching Authority, 13 pages.

* cited by examiner

ATTENUATION CIRCUIT AND METHOD OF CONTROLLING AN ATTENUATION CIRCUIT

FIELD OF THE INVENTION

The invention generally relates to phased arrays and, more particularly, the invention relates to attenuator circuits used with phased arrays.

BACKGROUND OF THE INVENTION

Antennas that emit electronically steered beams are known in the art as "phased array antennas." Such antennas are used worldwide in a wide variety of commercial and radar applications. They typically are produced from many small radiating elements that are individually phase controlled to form a beam in the far field of the antenna.

Phased array antennas often use attenuators to form the beam. Undesirably, such attenuators often suffer from degraded accuracy as the process parameters shift from manufacturing lot to lot. Temperature variations also can degrade accuracy of the attenuators.

SUMMARY OF VARIOUS EMBODIMENTS

In accordance with one embodiment of the invention, an attenuator circuit has an input configured to receive an input signal, an output configured to transmit an output signal, and a first attenuation path between the input and the output. The first attenuation path has a first active circuit device (e.g., a transistor) with a first on-resistance. The attenuator circuit also has a second attenuation path between the input and the output, and an attenuation control circuit configured to control attenuation through the first and second attenuation paths (i.e., controlling signal transmission through either path).

To that end, the attenuation control circuit has a second active circuit device with a second on-resistance, a voltage control device, and a control output coupled with the first active circuit device. The control output is configured to direct a control output signal to the first active circuit device. In addition, the attenuation control circuit also has a feedback loop coupled between the control output and the second active circuit device. The feedback loop is configured to direct the control output signal to the second active circuit device. Accordingly:

the control output signal is a function of the second on-resistance,
the second on-resistance is a function of the voltage control device, and
the first on-resistance is a function of the control output signal.

The attenuation control circuit may have a variable signal generator configured to control an active circuit device signal across the second active circuit device. As such, the control output signal is a function of the active circuit device signal. In addition, the variable signal generator may include a variable current generator and thus, the active circuit device signal may include a current. Moreover, the attenuation control circuit can include an operational amplifier having an op-amp output that is part of the control output, and first and second op-amp inputs. In that case, the voltage control device may be coupled with the first op-amp input, and the second active circuit device may be coupled with the second op-amp input. The second active circuit device may have a gate terminal configured so that the feedback loop is coupled with the gate terminal.

The attenuator circuit may have a third active circuit device with a third on-resistance, and an additional attenuation control circuit configured to control attenuation through the first and second attenuation paths. The additional attenuation control circuit in this embodiment has an additional voltage control device and a fourth active circuit device with a fourth on-resistance. The additional attenuation control circuit may have an additional control output coupled with the third active circuit device to direct an additional control output signal to the third active circuit device. In addition, the additional attenuation control circuit may have an additional feedback loop, coupled between the additional control output and the fourth active circuit device, configured to direct the additional control output signal to the fourth active circuit device. The additional control output signal preferably is a function of the fourth on-resistance, the fourth on-resistance preferably is a function of the additional voltage control device, and the third on-resistance preferably is a function of the additional control output signal.

The attenuator circuit preferably operates as part of a phased array. As such, the attenuator circuit may also include a phased array beam steering circuit operatively coupled with the output and configured to steer a beam in a phased array. Moreover, to optimize selectivity, the attenuator circuit may have a digital input coupled with the first active circuit device. In some embodiments, the voltage control device includes a resistance with a current source directing a controllable current though the resistance. The second active circuit device may include a transistor.

In accordance with another embodiment, a circuit for attenuating a signal has an input configured to receive an input signal, an output configured to transmit an output signal, a first attenuation path (having a first active circuit device) between the input and the output, and a second attenuation path between the input and the output. The circuit also has an operational amplifier that, like most operational amplifiers, has a first op-amp input, a second op-amp input, and an op-amp output. In addition, the circuit has a voltage control device coupled with the first op-amp input, and a second active circuit device having a first active terminal coupled with the second op-amp input. A feedback loop is coupled between the op-amp output and a second active terminal of the second active circuit device. Moreover, the op-amp output also is coupled with the first active circuit device.

In accordance with other embodiments, a method controls an attenuator having an input configured to receive an input signal, an output configured to transmit an output signal, a first attenuation path between the input and the output, and a second attenuation path between the input and the output. The first attenuation path has a first active circuit device with a first on-resistance. The method provides an operational amplifier with a first op-amp input, a second op-amp input, and an op-amp output, and drives a control voltage from a voltage control device to the first op-amp input. The method also controls the voltage at the second op-amp input to cause the op-amp output to produce a prescribed control output signal. The method controls this voltage by feeding back the control output signal toward the second op-amp input via a second active circuit device having a second on-resistance. The control output signal is a function of the second on-resistance, the second on-resistance is a function of the control voltage, and the first on-resistance is a function of the control output signal.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments significantly improve the accuracy of a variable gain amplifier by mitigating the impact of both thermal drift and varying device parameters across different manufacturing lots. To that end, the amplifier includes an attenuator having a closed loop controlling circuit that more accurately controls the on-resistance of various switches as a function of a known voltage or resistance. Moreover, the attenuator may implement this closed loop controlling circuit attenuator controller to enable use of a single unit cell attenuator that produces a range of attenuation values. Details of illustrative embodiments are discussed below.

Although it may be used with other systems, various embodiments are customized for use with the attenuator of an active electronically steered antenna system ("AESA system"). Use of the attenuator in this application has specialized requirements and thus, various embodiments may require significant changes to operate in another type of system/environment. In addition, although certain details of various embodiments of an AESA system are discussed below, those skilled in the art can apply some embodiments to other AESA systems. Accordingly, discussion of an AESA system does not necessarily limit certain other embodiments.

Active Electronically Steered System Example

Figure 1:
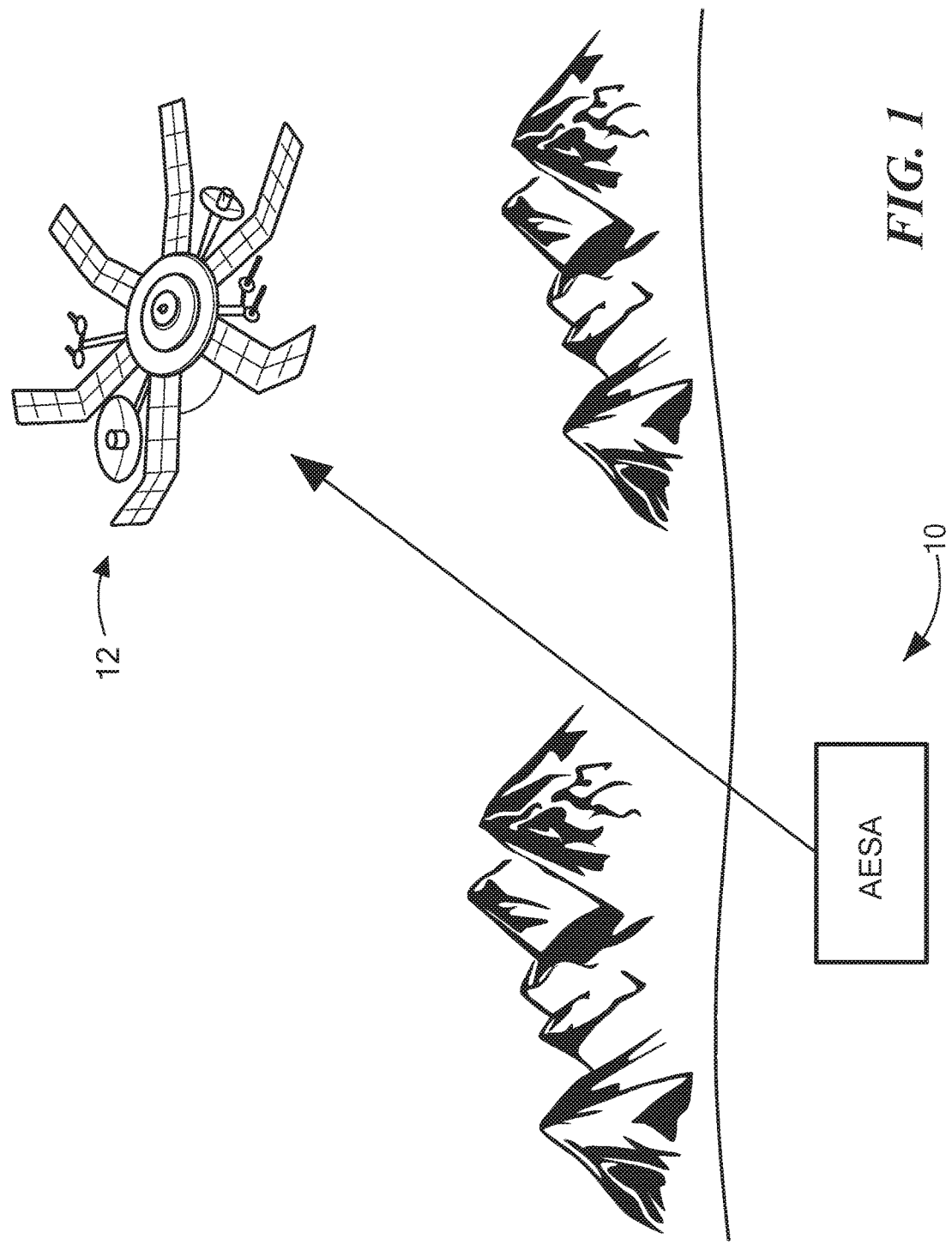
FIG. 1 schematically shows an active electronically steered antenna system ("AESA system") configured in accordance with illustrative embodiments of the invention and communicating with a satellite.

FIG. 1 schematically shows an active electronically steered antenna system ("AESA system 10") configured in accordance with illustrative embodiments of the invention and communicating with an orbiting satellite 12. A phased array (discussed below and identified by reference number "10A") implements the primary functionality of the AESA system 10. Specifically, as known by those skilled in the art, the phased array 10A forms one or more of a plurality of electronically steerable beams that can be used for a wide variety of applications. As a satellite communication system, for example, the AESA system 10 preferably is configured operate at one or more satellite frequencies. Among others, those frequencies may include the Ka-band, Ku-band, and/or X-band.

The satellite communication system may be part of a cellular network operating under a known cellular protocol, such as the 3G, 4G (e.g., LTE), or 5G protocols. Accordingly, in addition to communicating with satellites, the system may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 (implementing the noted phased array 10A) in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

Figure 2A:
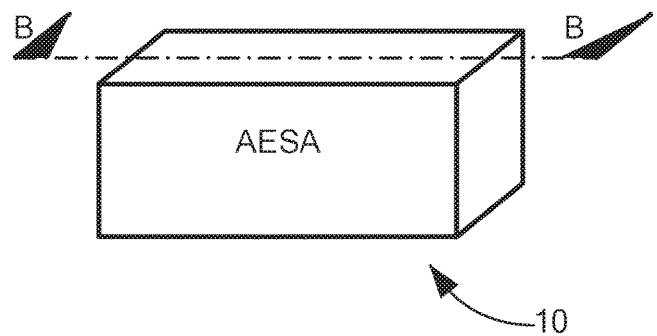
FIGS. 2A and 2B schematically show generalized diagrams of an AESA system that may be configured in accordance with illustrative embodiments of the invention.
Figure 2B:
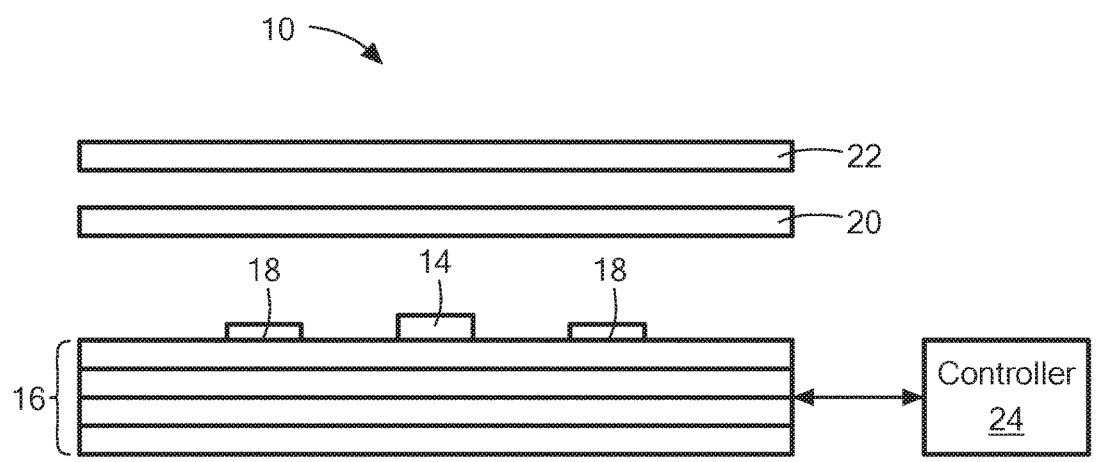

FIGS. 2A and 2B schematically show generalized diagrams of the AESA system 10 configured in accordance with illustrative embodiments of the invention. Specifically, FIG. 2A schematically shows a block diagram of the AESA system 10, while FIG. 2B schematically shows a cross-sectional view of a small portion of the same AESA system 10 across line B-B. This latter view shows a single silicon integrated circuit 14 (controlling elements 18, discussed below) mounted onto a substrate 16 between two transmit and/or receive elements 18, i.e., on the same side of a supporting substrate 16 and juxtaposed with the two elements 18. In alternative embodiments, however, the integrated circuit 14 could be on the other side/surface of the substrate 16. The phased array 10 also has a polarizer 20 to selectively filter signals to and from the phased array 10, and a radome 22 to environmentally protect the phased array 10. A separate antenna controller 24 (FIG. 2B) electrically connects with the phased array 10 to calculate beam steering vectors for the overall phased array 10, and to provide other control functions.

Figure 3A:
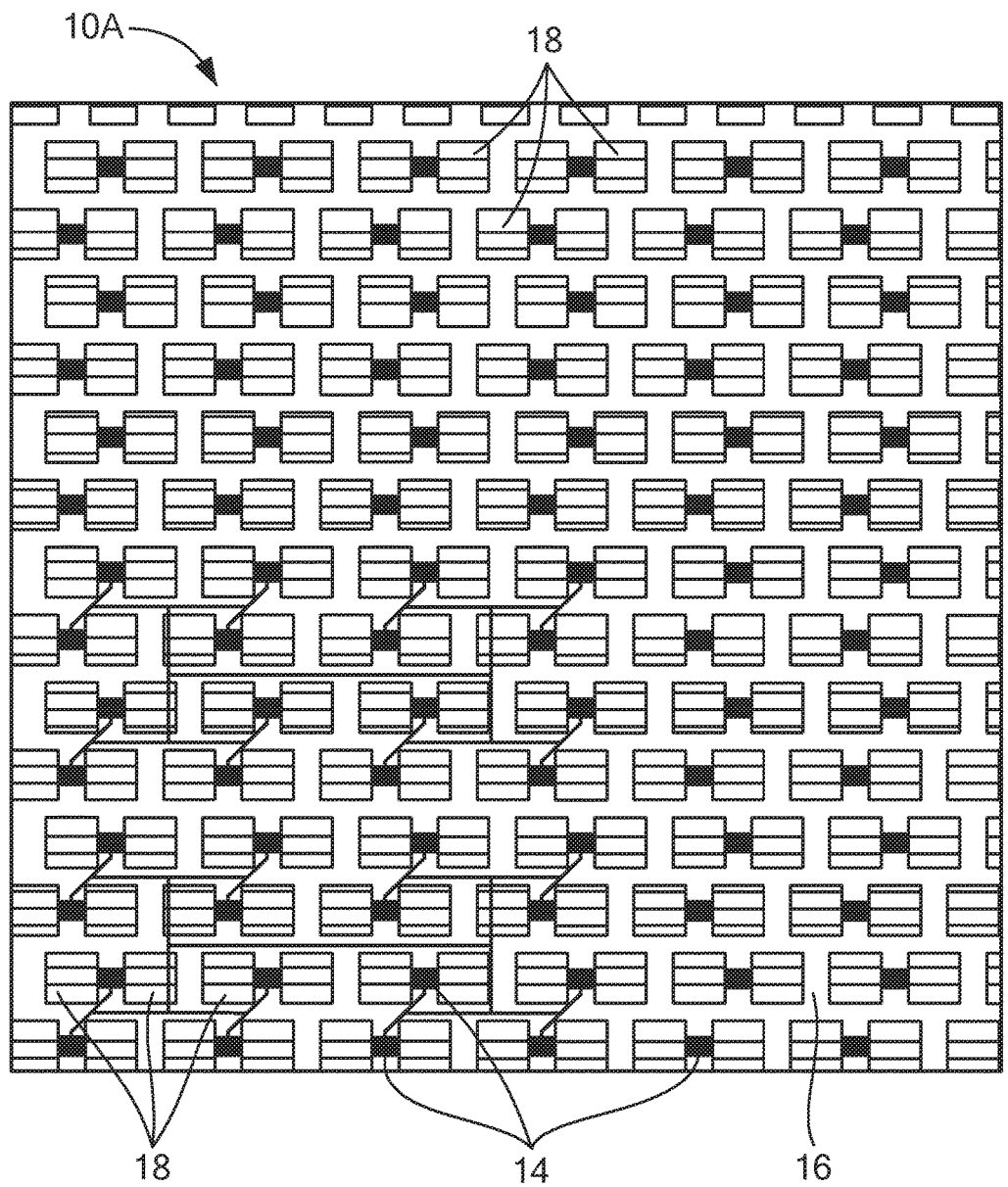
FIG. 3A schematically shows a plan view of a laminar printed circuit board portion of an AESA configured in accordance with illustrative embodiments of the invention.

FIG. 3A schematically shows a plan view of a primary portion of an AESA system 10 that may be configured in accordance with illustrative embodiments of the invention. In a similar manner, FIG. 3B schematically shows a close-up of a portion of the phased array 10A of FIG. 3A.

Specifically, the AESA system 10 of FIG. 3A is implemented as a laminar phased array 10A having a laminated printed circuit board 16 (i.e., acting as the substrate and also identified by reference number "16") supporting the above noted plurality of elements 18 and integrated circuits 14. The elements 18 preferably are formed as a plurality of square or rectangular patch antennas oriented in a triangular patch array configuration. In other words, each element 18 forms a triangle with two other adjacent elements 18. When compared to a rectangular lattice configuration, this triangular lattice configuration requires fewer elements 18 (e.g., about 15 percent fewer in some implementations) for a given grating lobe free scan volume. Other embodiments, however, may use other lattice configurations, such as a pentagonal configuration or a hexagonal configuration. Moreover, despite requiring more elements 18, some embodiments may use a rectangular lattice configuration. Like other similar phased arrays, the printed circuit board 16 also may have a ground plane (not shown) that electrically and magnetically cooperates with the elements 18 to facilitate operation.

Figure 3B:
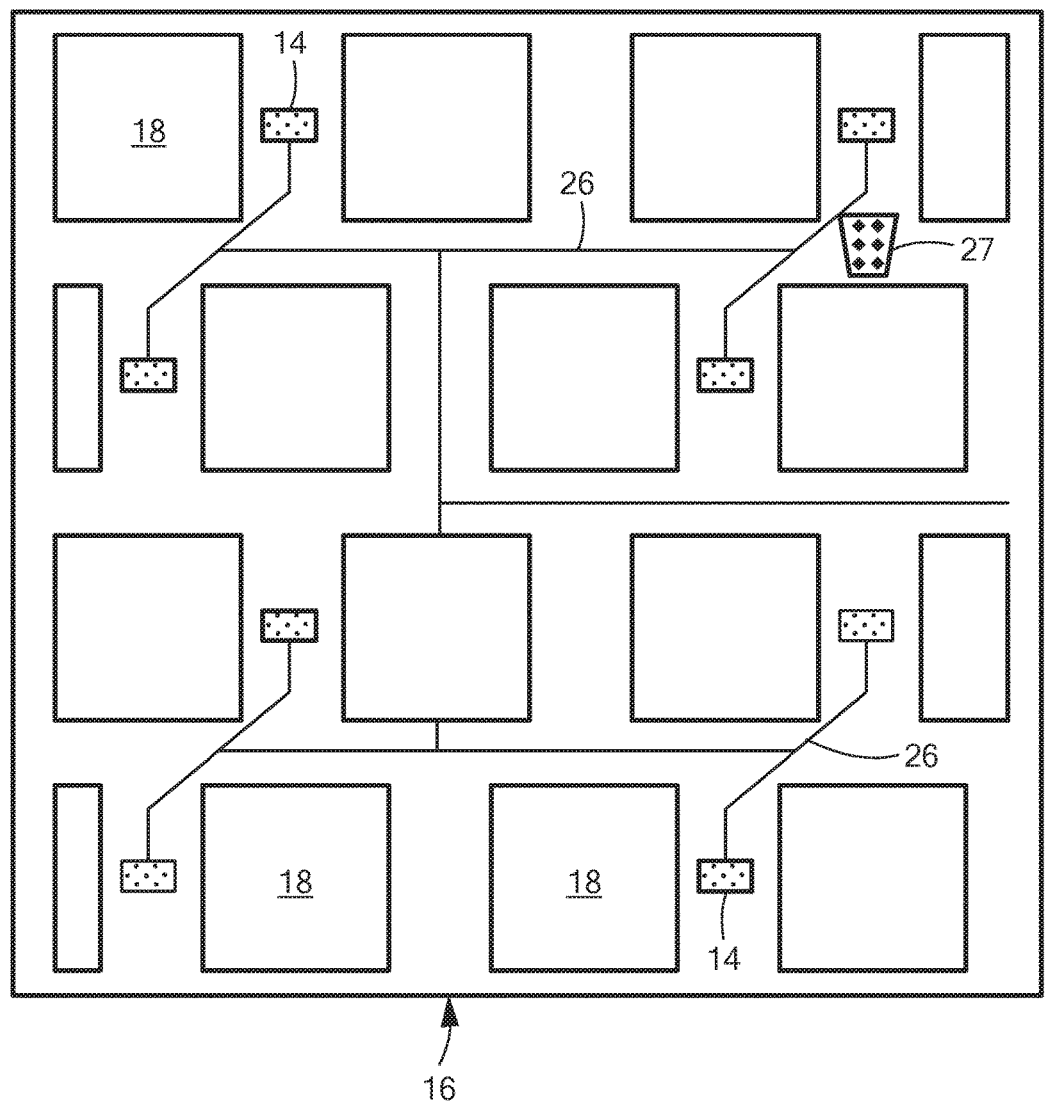
FIG. 3B schematically shows a close-up of a portion of the laminated printed circuit board of FIG. 3A.

Indeed, the array shown in FIGS. 3A and 3B is a small phased array 10A. Those skilled in the art can apply principles of illustrative embodiments to laminar phased arrays 10A with hundreds, or even thousands of elements 18 and integrated circuits 14. In a similar manner, those skilled in the art can apply various embodiments to smaller phased arrays 10A.

Figure 10:
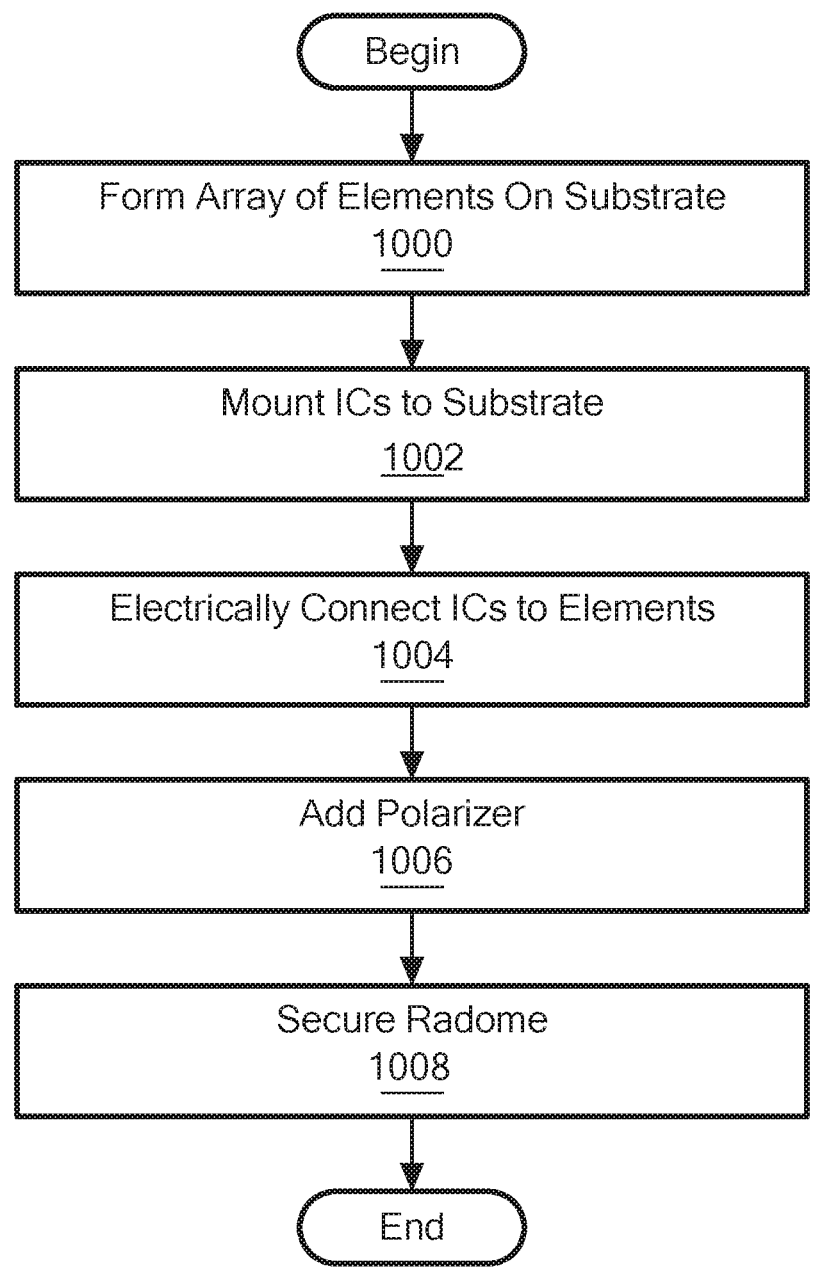
FIG. 10 shows a process of forming an AESA system in accordance with illustrative embodiments of the invention.

As a patch array, the elements 18 have a low profile. Specifically, as known by those skilled in the art, a patch antenna (i.e., the element 18) typically is mounted on a flat surface and includes a flat rectangular sheet of metal (known as the patch and noted above) mounted over a larger sheet of metal known as a "ground plane." A dielectric layer between the two metal regions electrically isolates the two sheets to prevent direct conduction. When energized, the patch and ground plane together produce a radiating electric field. As discussed below with regard to FIG. 10, illustrative embodiments may form the patch antennas using conventional semiconductor fabrication processes, such as by depositing one or more successive metal layers on the printed circuit board 16. Accordingly, using such fabrication processes, each radiating element 18 in the phased array 10A should have a very low profile.

The phased array 10A can have one or more of any of a variety of different functional types of elements 18. For example, the phased array 10A can have transmit-only elements 18, receive-only elements 18, and/or dual mode receive and transmit elements 18 (referred to as "dual-mode elements 18"). The transmit-only elements 18 are configured to transmit outgoing signals (e.g., burst signals) only, while the receive-only elements 18 are configured to receive incoming signals only. In contrast, the dual-mode elements 18 are configured to either transmit outgoing burst signals, or receive incoming signals, depending on the mode of the phased array 10A at the time of the operation. Specifically, when using dual-mode elements 18, the phased array 10A can be in either a transmit mode, or a receive mode. The noted controller 24 at least in part controls the mode and operation of the phased array 10A, as well as other array functions.

The AESA system 10 has a plurality of the above noted integrated circuits 14 (mentioned above with regard to FIG. 2B) for controlling operation of the elements 18. Those skilled in the art often refer to these integrated circuits 14 as "beam steering integrated circuits." Each integrated circuit 14 preferably is configured with at least the minimum number of functions to accomplish the desired effect. Indeed, integrated circuits 14 for dual mode elements 18 are expected to have some different functionality than that of the integrated circuits 14 for the transmit-only elements 18 or receive-only elements 18. Accordingly, integrated circuits 14 for such non-dual-mode elements 18 typically have a smaller footprint than the integrated circuits 14 that control the dual-mode elements 18. Despite that, some or all types of integrated circuits 14 fabricated for the phased array 10A can be modified to have a smaller footprint.

As an example, depending on its role in the phased array 10A, each integrated circuit 14 may include some or all of the following functions:
  phase shifting,
  amplitude controlling/beam weighting,
  switching between transmit mode and receive mode,
  output amplification to amplify output signals to the elements 18,
  input amplification for received RF signals (e.g., signals received from the satellite 12), and
  power combining/summing and splitting between elements 18.

Indeed, some embodiments of the integrated circuits 14 may have additional or different functionality, although illustrative embodiments are expected to operate satisfactorily with the above noted functions. Those skilled in the art can configure the integrated circuits 14 in any of a wide variety of manners to perform those functions. For example, the input amplification may be performed by a low noise amplifier, the phase shifting may use conventional active phase shifters, and the switching functionality may be implemented using conventional transistor-based switches. Additional details of the structure and functionality of integrated circuits 14 are discussed below with reference to FIG. 5A.

As noted above, the AESA system 10 preferably communicates with one or more orbiting satellites 12 and thus, uses satellite frequencies for that communication. Accordingly, the plurality of integrated circuits 14 preferably are configured operate the phased array 10A at one or more frequencies of the Ka-band, Ku-band, and/or X-band to communicate with at least one satellite 12. Of course, as satellite communication technology progresses, future implementations may modify the frequency bands of the integrated circuits 14 to communicate using new satellite frequencies.

In illustrative embodiments, multiple elements 18 share the integrated circuits 14, thus reducing the required total number of integrated circuits 14. This reduced number of integrated circuits 14 correspondingly reduces the required size of the printed circuit board 16, which reduces the cost of the AESA system 10. In addition, more surface area on the top face of the printed circuit board 16 may be dedicated to the elements 18.

To that end, each integrated circuit 14 preferably operates on at least one element 18 in the array. For example, one integrated circuit 14 can operate on two or four different elements 18. Of course, those skilled in the art can adjust the number of elements 18 sharing an integrated circuit 14 based upon the application. For example, a single integrated circuit 14 can control two elements 18, three elements 18, five elements 18, six elements 18, seven elements 18, eight elements 18, etc., or some range of elements 18. Sharing the integrated circuits 14 between multiple elements 18 in this manner reduces the required total number of integrated circuits 14, correspondingly reducing the required size of the printed circuit board 16.

As noted above, the dual-mode elements 18 may operate in a transmit mode, or a receive mode. To that end, the integrated circuits 14 may generate time division diplex or duplex waveforms so that a single aperture or phased array 10A can be used for both transmitting and receiving. In a similar manner, some embodiments may eliminate a commonly included transmit/receive switch in the side arms (discussed below with regard to FIG. 5 and noted above) of the integrated circuit 14. Instead, such embodiments may duplex at the element 18. This process can be performed by isolating one of the elements 18 between transmit and receive by an orthogonal feed connection. Such a feed connection may eliminate about a 0.8 dB switch loss and improve G/T (i.e., the ratio of the gain or directivity to the noise temperature) by about 1.3 dB for some implementations.

RF interconnect and/or beam forming lines 26 electrically connect the integrated circuits 14 to their respective elements 18. To further minimize the feed loss, illustrative embodiments mount the integrated circuits 14 as close to their respective elements 18 as possible. Specifically, this close proximity preferably reduces RF interconnect line lengths, reducing the feed loss. To that end, each integrated circuit 14 preferably is packaged either in a flip-chipped configuration using wafer level chip scale packaging (WLCSP), or a traditional package, such as quad flat no-leads package (QFN package). While other types of packaging may suffice, WLCSP techniques are preferred to minimize real estate on the substrate 16. In addition to reducing feed loss, using WLCSP techniques reduces the overall footprint of the integrated circuits 14, enabling them to be mounted on the top face of the printed circuit board 16 with the elements 18—providing more surface area for the elements 18.

It should be reiterated that although FIGS. 3A and 3B show the AESA system 10 with some specificity (e.g., the layout of the elements 18 and integrated circuits 14), those skilled in the art may apply illustrative embodiments to other implementations. For example, as noted above, each integrated circuit 14 can connect to more or fewer elements 18, or the lattice configuration can be different. Accordingly, discussion of the specific configuration of the AESA system 10 of FIG. 3A (and other figures) is for convenience only and not intended to limit all embodiments.

Figure 4:
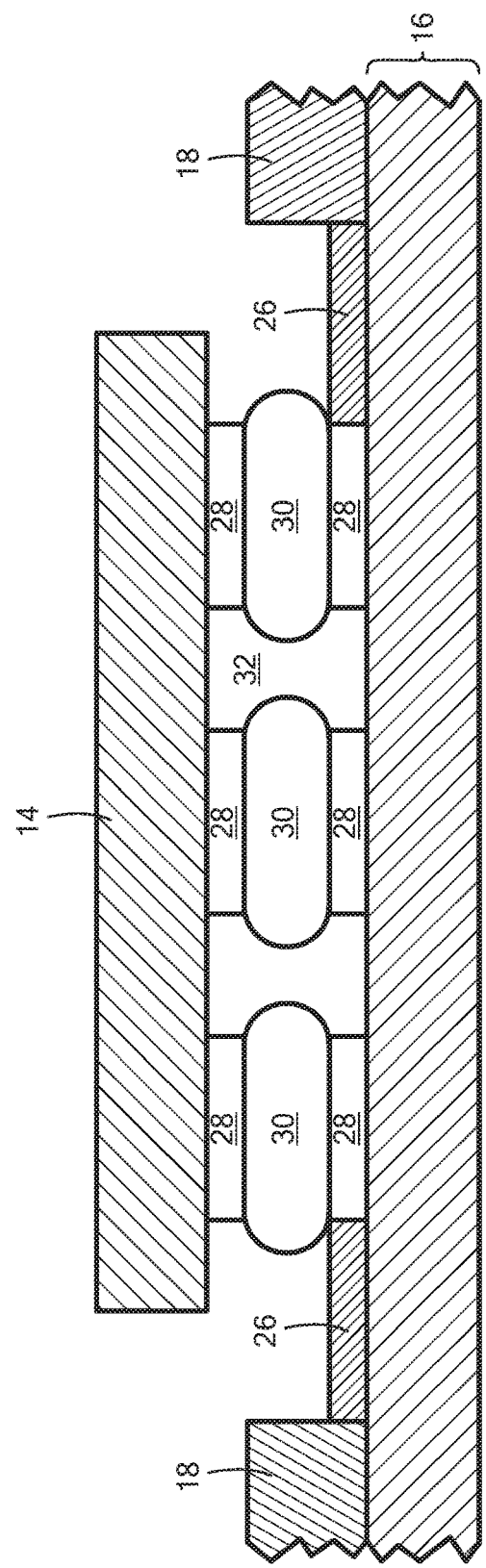
FIG. 4 schematically shows a cross-sectional view of the laminated printed circuit board of 3A to highlight the mounting of its integrated circuits.

FIG. 4 schematically shows a cross-sectional view of the layout of components on the laminated printed circuit board 16 of FIG. 3A to highlight the flip-chip mounting of its integrated circuits 14. The integrated circuit 14 in this drawing intentionally is enlarged to show details of a flip-chip mounting technique. Unlike techniques that permit input/output ("I/O") only on the edge of the integrated circuit 14, flip-chip mounting permits I/O on interior portions of the integrated circuit 14.

As shown, the integrated circuit 14 has a plurality of pads 28 aligned with a plurality of corresponding pads 28 on the printed circuit board 16. These opposing pads 28 on the integrated circuit 14 and the printed circuit board 16 may be considered to form pairs of pads 28. Solder 30 (e.g., solder balls) electrically connects each the pads in corresponding pairs of pads 28. Interconnect lines, traces, and other electrical interconnects on/in the printed circuit board 16 (e.g., lines 26) thus permit the integrated circuit 14 to communicate with other elements 18 through this electrical interface.

The embodiment shown in FIG. 4 forms a space or void (identified by reference number "32") between the bottom of the integrated circuit 14 (from the perspective of this drawing) and the top surface of the printed circuit board 16. This space 32 may remain an open void—containing no material. Some embodiments may take advantage of this extra space 32 to add further components, such as additional circuit elements, without requiring more circuit board space. Alternatively, this space 32 may contain fill material (not shown) for further stability and thermal management of the integrated circuit 14.

Other embodiments, however, still may use similar integrated circuits 14, but not use flip-chip mounting techniques. Instead, other mounting techniques may couple the integrated circuits 14 with the substrate 16. Among other things, those techniques may incorporate surface mounting, or wirebond mounting with the integrated circuit 14 rotated 180 degrees from the orientation of FIG. 4. Accordingly, discussion of flip chip mounting techniques is but one of a variety of different techniques that may be used with various embodiments of the invention.

Figure 5:
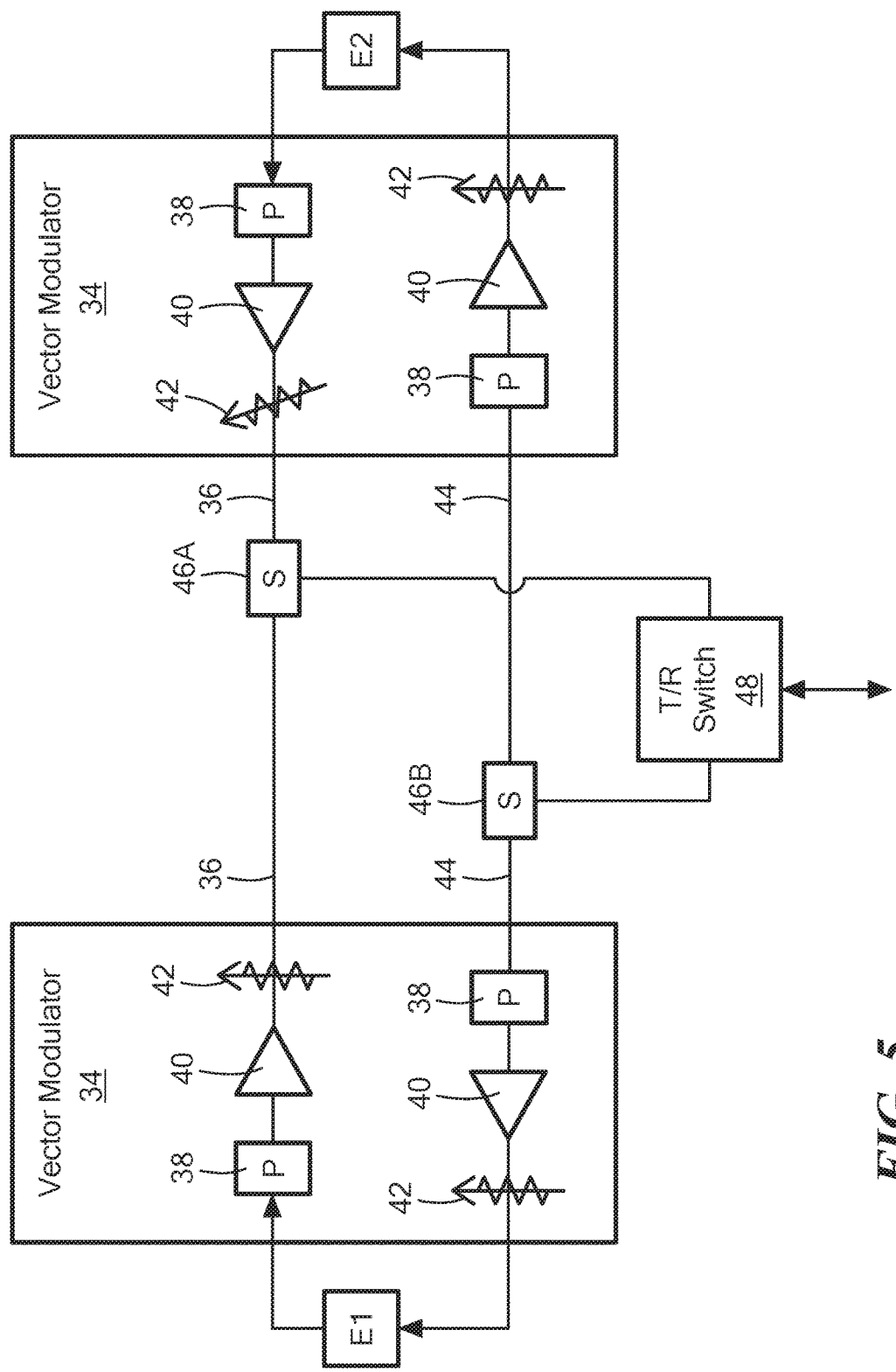
FIG. 5 schematically shows a circuit diagram of a portion of an integrated circuit mounted on the laminated printed circuit board of FIG. 3A.

As noted above, each integrated circuit 14 preferably has a minimal amount of circuitry to perform its required function. To that end, FIG. 5 schematically shows relevant portions of one integrated circuit 14 that may be configured in accordance with illustrative embodiments of the invention to control two elements 18. This exemplary integrated circuit 14 is shown and described as connected to two different elements 18 identified as element E1 and element E2. Of course, principles described with regard to FIG. 5A can apply equally to integrated circuits 14 controlling more than two elements 18, such as four elements 18.

As shown, the integrated circuit 14 has a first vector modulator 34 for controlling receipt and transmission of signals of a first element E1, and a second vector modulator 34 for controlling receipt and transmission of signals of a second element E2. The two vector modulators 34 each have a receive arm 36, coupled to their respective elements 18, for receiving signals. In FIG. 5, because they transmit signals away from their elements E1 or E2, the receive arms 36 have arrows pointing away from their respective elements E1 and E2. To that end, each receive arm 36 has a phase shift modulator 38 (also referred to as a "phase shifter 38") for changing the phase of the incoming signals, and an amplifier 40 for amplifying the incoming signal. Among other things, the amplifiers 40 in the receive arms 36 are implemented as low noise amplifiers.

In illustrative embodiments, the amplifier 40 is a fixed gain amplifier. Accordingly, to control the amplification with more precision, each receive arm 36 also has an active gain controller 42 that increases or decreases the amplification provided by the amplifier 40. Alternatively, the amplifier 40 may be a variable gain amplifier. Accordingly, in that case, the active gain controller 42 may be omitted. As known by those skilled in the art, the amplifier(s) 40 and the phase shifter 38 cooperate to control incoming received signals.

In a corresponding manner, the two vector modulators 34 also each have a transmit arm 44 coupled to their respective elements 18. In an opposite manner to the receive arms 36, the transmit arms 44 in FIG. 5A have arrows pointing toward their respective elements 18. Each transmit arm 44 thus has a phase shifter 38 for changing the phase of the incoming signals, and an amplifier 40 for amplifying the incoming signal. The transmit arms 44 also may have an active gain controllers 42 if the transmit amplifiers 40 have a fixed gain. Alternatively, the transmit arms 44 may omit the active gain controllers 42 if the amplifier 40 is a variable gain amplifier. As known by those skilled in the art, the amplifier(s) 40 and the phase shifter 38 cooperate to steerably beam outgoing signals to other devices, such as to the satellite 12 of FIG. 1.

The phase shifter 38 preferably is a 4 bit phase shifter 38, which provides up to 16 different vectors for transmitting a beam from a given element. In illustrative embodiments, each of the 16 different vectors is substantially evenly partitioned between zero and 360 degrees (e.g., 0 degrees, 22.4 degrees, 45 degrees, etc.). Other embodiments, however, may use smaller phase shifters 38 (e.g., 3 bit phase shifters 38) or larger phase shifters 38 (e.g., 5 or 6 bit phase shifters 38). Again, this number should be coordinated with the number of elements 18, as well as the gain of the amplifiers 40. The amplifiers 40 may have active gain control from 1 dB up to 3 dB, 4 dB, 5 dB, or greater (e.g., 6 dB). Again, low gain amplifiers 40 used in this application should further reduce the size of the integrated circuit 14.

The receive arms 36 and the transmit arms 44 may be considered to be "side arms" that combine and/or distribute signals at a summation point (also referred to as a "splitter" when splitting signals). Specifically, the two receive arms 36 meet at a receiving summing node 46A that combines the received signals from both the first and second elements 18. In a corresponding manner, the two transmit arms 44 also meet at a transmitting summing node 46B that, in an opposite manner to that of the receiving summing node 46A, distributes the transmit signals of the first and second elements 18 for transmission. Among other things, the summing nodes 46 may be implemented as a compact Wilkinson power divider/summer, which, as its name suggests, distributes/divides and/or sums signals. Indeed, the summing nodes 46A and 46B may be implemented by other active components and thus, a Wilkinson power divider/summer is but one example.

In addition to connecting with the side arms, each summing node 46A also connects with a main arm (aka "common arm") that itself may have an amplifier and/or active gain controller (not shown). In illustrative embodiments, the gain of the amplifier in the main arm is greater than those in the side arms. The main arm also has a switch 48 that switches between the transmit mode to the receive mode.

Illustrative embodiments preferably do not have switches on the side arms. To that end, the transmit and receive sides of each vector modulator 34 preferably are physically coupled with adjacent sides of its element 18. Specifically, the elements 18 are sized and oriented so that, from side-to-side, they are about half the size of one anticipated wavelength of the signals being transmitted and received. In that case, the opposite sides will be about 180 degree out of phase with each other. Adjacent sides, however, are about 90 degrees out of phase with each other. In this manner, the transmit arms 44 may be considered to be polarized a first way, while the receive arms 36 may be considered to be polarized a second, orthogonal way. For example, the transmit arms 44 may be considered to be "vertically polarized" while the receive arms 36 may be considered to be "horizontally polarized."

Accordingly, the receive arms 36 in FIG. 5 connect with a top portion of their respective elements 18, while the transmit arms 44 of FIG. 5 connect with a side (orthogonal) portion of their respective elements 18. Those in the art recognize, however, that the receive and transmit arms 36 and 44 may be physically coupled with other adjacent sides to accomplish the same result. Indeed, other embodiments may polarize the receive and transmit arms 36 and 44 differently. As such, the specific polarization discussed above is but one example and not intended to limit various embodiments. Alternative embodiments may use other polarizations (e.g., non-orthogonal).

When coupled as shown, illustrative embodiments avoid the need for a switch on the side arms. Moreover, as noted above, using a duplexing/diplexing signal for transmit and receive further aids in this goal. For example, illustrative embodiments may use time division duplex/diplex waveforms or frequency division duplex/diplex waveforms to both transmit and receive signals. In that case, to permit asymmetric transmit and receive data transmission, the transmit and receive signals may be allocated to different time slots in the same frequency band. For example, one or more of the elements 18 may couple with a frequency diplexer (not shown) that splits its relevant signal into a first frequency signal and a second frequency signal. Each of the generated frequency signals is then routed to its own independent circuit that either receives or transmits to or from the element 18.

The duplex/diplex waveforms may be generated in a number of different ways. In some embodiments, the integrated circuits 14 are configured to produce those waveforms. In other embodiments, one or more diplexers or duplexers on the substrate 16 at least in part produce those waveforms. FIG. 3B schematically shows one such diplexer or duplexer, identified by reference number 27. This diplexer/duplexer 27 communicates with other components, such as the integrated circuits 14, using the transmission lines (e.g., traces, vias, lines, etc.) on the substrate 16.

During operation, the switch 48 in the main arm first may be set to the transmit mode. Accordingly, the main arm receives a transmit signal through the switch. Next, that signal is distributed to the two transmit arms 44 through the transmitting summing node 46B. In this capacity, the transmitting summing node 46B acts like a distribution node as it distributes the signal to be transmitted to each side arm. Next, each transmit arm 44 (in the respective vector modulators 34) then shifts and amplifies its received signal as needed, and transmits that conditioned signal through its respective element 18 to the orbiting satellite 12.

After the transmission process is completed, the switch 48 on the main arm may be actuated to the receive mode. Accordingly, each receive arm 36 shifts and amplifies the signal received by its respective element E1 or E2. The receiving summing node 46A then sums or combines these two conditioned signals to produce a combined signal that is forwarded to other components through the switch 48 in the main arm.

Of course, it should be noted that the specific configuration of elements 18 in FIG. 5 is but one of a wide variety of different configurations to accomplish the desired effect. Accordingly, when implementing various embodiments, those skilled in the art can add other components, remove components, or rearrange the noted components. The specific configuration of FIG. 5 therefore is intended to be illustrative and not intended to limit various embodiments the invention. Additional details of an example of the AESA system 10 that certain embodiments may implement are shown in co-pending U.S. patent application Ser. No. 15/267,704, filed Jun. 16, 2016, the disclosure of which is incorporated herein, in its entirety, by reference.

Control of Parametric, Temperature, and Lot Variations in Attenuators

As noted above, this AESA system 10 can suffer from transmit and/or receive inaccuracies due to uncontrollable parameters of certain of its elements. Generally, attenuators integrated in modern integrated circuits can suffer from a degraded accuracy as the process parameters of the device and the circuit shift from manufacturing lot to manufacturing lot. Attenuators also suffer in shifts due to temperature changes. This can have adverse implications for many applications, such as when used with the AESA system 10 described above.

This is especially true for certain silicon integrated circuit processes where the specific circuit components forming the attenuators have parameters with large thermal coefficients, as well as large variances in those same parameters from lot to lot. For example, the on-resistance of certain field effect transistors may vary over both temperature and process. This problem is exacerbated when other circuit components forming the attenuator (e.g., resistors and field effect transistors) have parameters that vary in an uncorrelated manner across different manufacturing lots, and the thermal coefficients of the different circuit components are not equal.

To address this problem, those skilled in the art may resort to extensive calibration, which can be prohibitively expensive for modern low-cost AESA systems. Rather than take such a brute force and often cost prohibitive approach, illustrative embodiments use a closed loop control circuit to equalize on-resistance of certain active circuit elements independent of process and temperature variations. For example, some embodiments may make the on-resistance of certain active devices proportional to the resistance of other components in the circuit (e.g., resistors and/or field effect transistors). Such an approach should permit a higher degree of attenuation accuracy across different manufacturing lots and temperatures.

Figure 6:
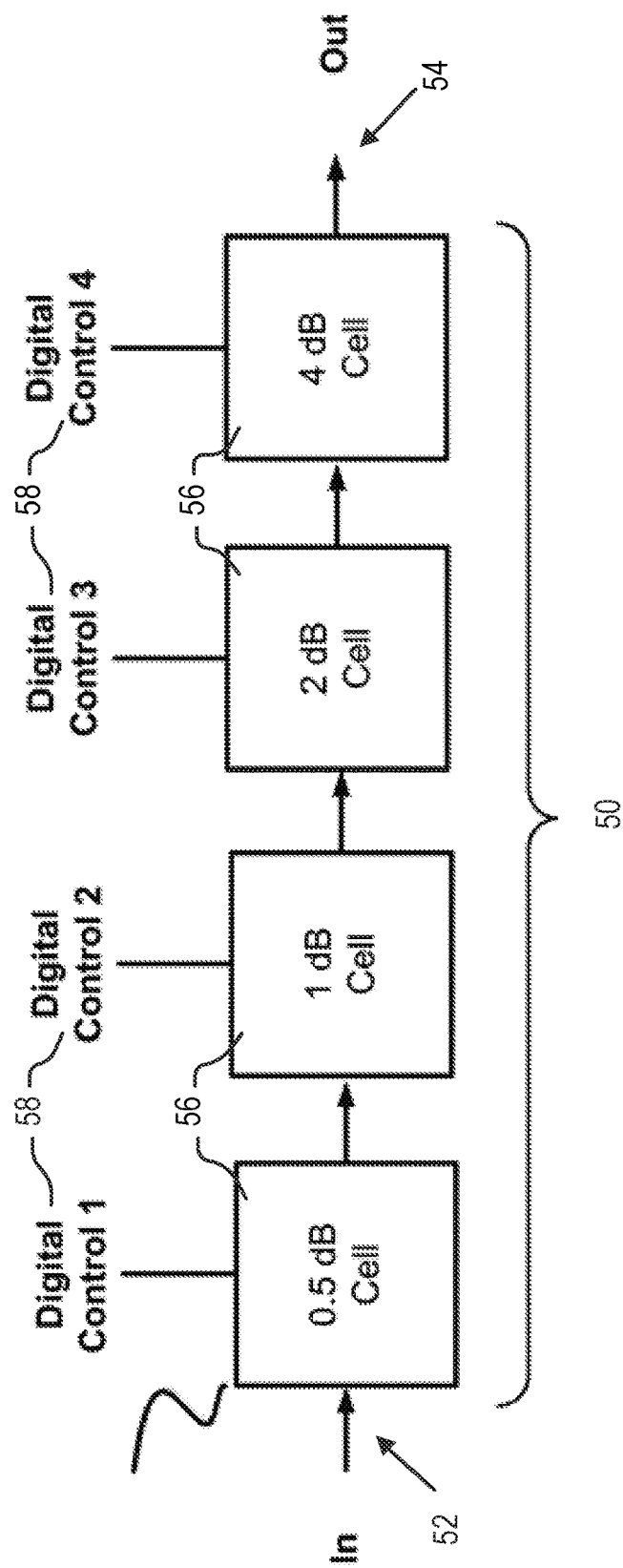
FIG. 6 schematically shows an attenuator that may be configured in accordance with illustrative embodiments of the invention.

To those ends, FIG. 6 schematically shows an attenuator 50 that may be configured in accordance with illustrative embodiments the invention. In some embodiments that use a fixed amplifier 40, the attenuator 50 may be considered to be part of the active gain controllers 42. Some embodiments using variable gain amplifiers, however, may implement the attenuator 50 as part of the amplifier 40. Yet other embodiments may implement the attenuator 50 as part of a system that is not necessarily integrated with the amplifier 40 and/or active gain controllers 42. Indeed, the attenuator 50 may be part of either or both the transmit and receive arms 36 and 44. Other embodiments (e.g., the below unit cell attenuators) also may similarly be considered part of the active gain controllers 42, amplifier 40, or a separate system in either or both the transmit and receive arms 36 and 44.

As shown, this attenuator 50 is implemented in the form of a digital step attenuator having an input 52 for receiving a signal (e.g., an RF signal), an output 54 for transmitting and/or attenuating the input signal, and four unit cell attenuators 56 between the input 52 and the output 54. These unit cell attenuators 56 are preferably weighted in a binary fashion, although other embodiments may weight them differently. In this case, from left to right in the figure, the unit cell attenuators 56 are organized as having attenuations of 0.5 dB, 1.0 dB, 2.0 dB, and 4 dB. As a digital step attenuator, this attenuator 50 is implemented so that only selected unit cell attenuators 56 are in an "attenuation" state at certain prescribed times. Accordingly, each unit cell attenuator 56 has a digital control input 58 for receiving an enabling signal. Receipt of no signal or a non-enable signal renders a given unit cell attenuator 56 in an "insertion loss" state, while receipt of an enable signal renders the given unit cell attenuator 56 in an "attenuation" state. Of course, alternative embodiments may work in an opposite manner by rendering the given unit cell attenuator 56 in the insertion loss state upon receipt of an enable signal, and in the attenuation state upon receipt of no signal or a non-enable signal. In either case, as a single attenuator device, the four digital control inputs 58 may be considered to form a single digital input for receiving a four bit word.

It should be noted that the attenuations noted for the unit cell attenuators 56 above does not take into account their insertion loss—the signal loss from the input 52 to the output 54 when in the insertion loss state. For example, each of the units may have an insertion loss of 1 dB. In that case, even when all units are in the insertion loss state, the insertion loss (i.e., attenuation) from the attenuator input 52 to the output 54 will be at least about 4 dB. In that case, the first cell on the left may have a total attenuation of 1.5 dB when it is in the attenuation state.

Figure 7:
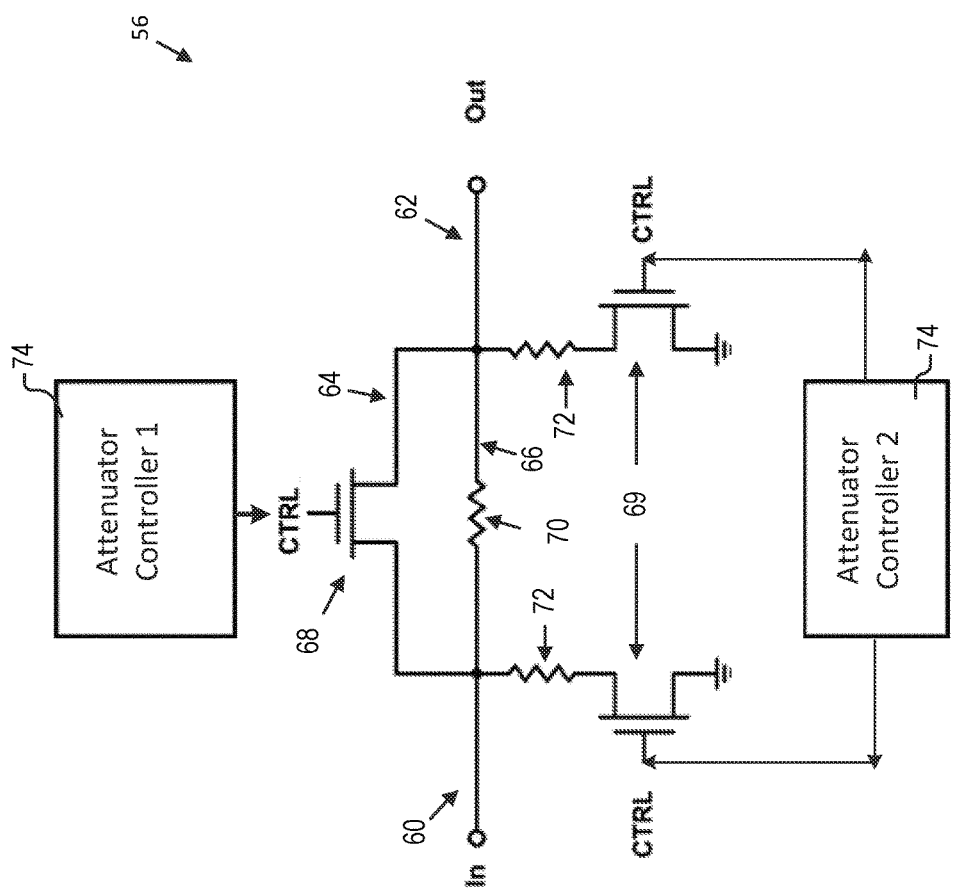
FIG. 7 schematically shows details of one of the digital attenuators of FIG. 6 configured in accordance with illustrative embodiments of the invention.

FIG. 7 schematically shows additional details of one of the unit cell attenuators 56 configured in accordance with illustrative embodiments of the invention. This figure shows a specific type of unit cell attenuator 56—known as a "Pi" attenuator. Those skilled in the art can apply various embodiments to other types of attenuator designs, such as "T-attenuators." Accordingly, discussion of the specific Pi attenuator is for example only.

As shown, the unit cell attenuator 56 has a unit input 60 configured to receive an input signal, and a unit output 62 configured to transmit an output signal. In addition, the unit cell attenuator 56 has two alternative paths for passing an input signal from the unit input 60 to the unit output 62. Specifically, the unit cell attenuator 56 has a lower attenuation path 64 generally parallel with a higher attenuation path 66 between the unit input 60 and unit output 62. The lower attenuation path 64 has a low resistance first switch 68 (discussed below), while the higher attenuation path 66 has a resistance 70, such as a resistor.

The unit cell attenuator 56 also has a switching arrangement that controllably directs the input signal to one path 64 or 66 at a given time, or both paths 64 and 66. When directed to just the higher attenuation path 66, the unit cell attenuator 56 maximally attenuates the input signal. Conversely, when directed to just the lower attenuation path 64, the unit cell attenuator 56 minimally attenuates (e.g., no attenuation or a small amount of attenuation) the input signal. When directed through both paths 64 and 66, however, the unit cell attenuator attenuates the input signal an amount that is between the maximum and minimum attenuation. As discussed below, varying the input voltage into the inputs of the various switches can provide a range of different attenuations to provide a range of attenuations between a maximum attenuation and a minimum attenuation. In other words, the single unit cell attenuator 56 can provide a range that is the same as, or greater than, the range provide by the attenuator 50 of FIG. 6 (which has multiple unit cell attenuators 56). That range of attenuations can equal the range provided by the attenuator 50 of FIG. 6. Some embodiments combine both implementations. Illustrative embodiment may embody these and related implementations.

To those ends, the unit cell attenuator 56 has the noted first switch 68, and a pair of second switches 69 extending from common nodes in parallel with the lower and higher attenuation paths 64 and 66. Each of the second switches 69 also may have a resistance 72 coupled between one of the common nodes and one terminal of one of the second switches 69.

In preferred embodiments, the switches 68 and 69 are implemented as N-channel metal oxide semiconductor field effect transistors (MOSFETs) and thus, have three terminals; namely a gate terminal, a drain terminal and a source terminal. As shown, the drain terminal of each of the second switches 69 is coupled to the noted common node through the resistance 72 (or directly connected to the nodes), which can include one or more resistors. Correspondingly, the source terminal of each of the second switches 69 is coupled to ground. In addition, the drain of the first switch 68 (in the lower attenuation path 64) is coupled with the unit input 60, while the source of the first switch 68 is coupled with the unit output 62. Those skilled in the art can optimize this circuit by adding additional components, such as by adding more resistors to one of the two paths.

The states of all the switches 68 and 69 are controlled by input voltages at the gates of all the switches 68 and 69. To that end, the unit cell attenuator 56 includes two attenuation controllers 74 that preferably provide inverted outputs— those two attenuator controllers 74 (for simplicity, these two specific attenuator controllers 74 are referred to as "attenuator controller 1" and "attenuator controller 2") produce opposite outputs at the same time. For example, attenuator controller 1 produces a lowest prescribed analog voltage (see below) when attenuator controller 2 produces a highest prescribed analog voltage (see below), and vice versa. Attenuator controllers 1 and 2 are configured to move in opposite directions.

The output signal of attenuator controllers 1 and 2 are analog signals. Accordingly, the control voltage applied to the first switch 68 increases as the control voltage to the second switches 69 decrease. When in the active regions of the MOSFETS/switches 68 and 69, after the threshold voltage is achieved, these increasing and decreasing voltages can cause correspondingly varying, non-DC signal currents to pass through the switches 68 and 69. Accordingly, the input signal, at the input 60, can pass a range of its signal through both branches 64 or 66, depending on the input voltage at the switch 68, producing a corresponding range of net signal attenuations at the output 62. Thus, as noted above, the single unit cell attenuator 56 may serve the same purpose of the noted series of unit cell attenuators 56 because it has the ability to have the same as or more attenuation options/states (or less if needed).

Alternative embodiments may use a single attenuator controller 74, feeding the output signal from the single attenuator controllers 74 to one of sets of switches 68, 69, and also feeding the output signal to the other of the set of switches 68/69 through an inverter circuit (not shown). For example, the single attenuator controller 74 in this alternative embodiment may generate a first voltage, which the first switch 68 receives without change. The second switches 69 then receive, after passing through the noted inverter, inverted versions of that first voltage. Yet other embodiments may use attenuator controllers 74 to feed each of the switches 68 and 69 individually. In this case, the unit cell attenuator 56 would have three attenuator controllers.

Also during use, when attenuator controller 1 is set to produce a lowest prescribed analog voltage, attenuator controller 2 is set to the highest prescribed analog voltage. In this state, the first switch 68 is set to a maximum insertion loss state, and the second switches 69 are set to a maximum attenuation state. Therefore, the input signal will traverse primarily through the higher attenuation path 66, thus receiving the desired maximum attenuation before being transmitted through the unit output 62. In the opposite state at the other end of the control voltage range, when attenuator controller 1 is set to highest prescribed analog voltage, and attenuator controller 2 is set to its lowest prescribed analog voltage, both of the second switches 69 are off, effectively producing an open circuit. The first switch 68 is on, however, to provide a low resistance path through the lower attenuation path 64 to the unit output 62, producing a minimal attenuation.

As noted above, problems can arise when the circuit elements making up the attenuator controllers 74, as well as the circuit elements in the rest of the unit cell attenuator 56, have different parameters and thermal coefficients. For example, with varying on-resistances, the switches 68 and/or 69 may not attenuate at the appropriate level, undesirably causing the AESA system to misdirect or mis-shape beams formed by the array. Illustrative embodiments solve this problem by matching components to a prescribed controlling voltage and/or resistance.

Figure 8A:
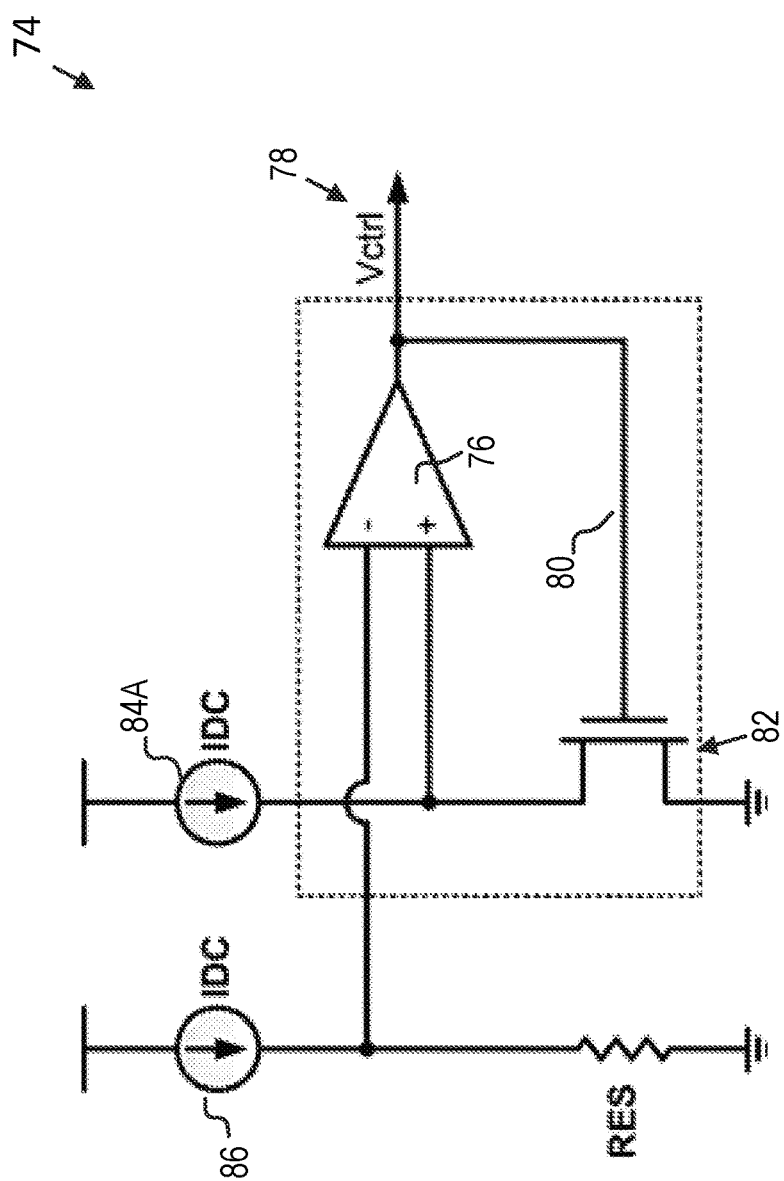
FIGS. 8A and 8B schematically show two embodiments of an attenuator controller configured in accordance with illustrative embodiments of the invention.

To that end, FIG. 8A schematically shows details of an illustrative attenuator controller 74 that mitigates these problems. As shown, the attenuator controller 74 includes an operational amplifier 76 (op-amp 76) having an op-amp output that serves as the output 78 for the attenuator controller 74 itself. Accordingly, the op-amp output electrically couples with the gates of the first or second transistors 68 and 69 of the attenuator in FIG. 7, thus controlling operation of the attenuator 56. The op-amp output also is coupled with a feedback loop 80 that connects to a variable resistance circuit element 82, and back to the positive input of the op-amp 76. A first current source 84A in this embodiment directs a DC current through the variable resistance circuit element 82 to produce a voltage at the positive input of the op-amp 76.

In illustrative embodiments, the variable resistance circuit element 82 is the same as one or more other circuit elements in the unit cell attenuator 56. Specifically, in this implementation, the variable resistance circuit element 82 is implemented as a n-channel MOSFET ("control MOSFET 82") that is substantially similar to, or the same as, the switches 68 and 69 shown in FIG. 7 (i.e., the first and second switches 68 and 69). In this implementation, the first current source 84A directs current through the control MOSFET 82 to vary the on-resistance of the control MOSFET 82 as a function of the voltage at the negative input of the op-amp 76. This on-resistance also is controlled by the constant voltage at the negative input of the op-amp 76.

Specifically, as known by those skilled in the art, in general, the on-resistance of a field effect transistor essentially is the resistance between the drain and the source when in the "on" state (i.e., when the gate-to-source voltage exceeds the threshold voltage, permitting current flow through the transistor). As also known by those skilled in the art, the "on" resistance can vary to some extent based on a number of factors, such as the gate to source voltage applied, in illustrative embodiments, by the attenuator controller 74. Specifically, an increased gate to source voltage decreases the on-resistance, while a decreased gate to source voltage increases the on-resistance.

Those skilled in the art recognize that the positive and negative inputs of the op-amp 76 are generally forced to be at the same voltage. Accordingly, the attenuator controller 74 sets the voltage at the negative input terminal of the op-amp 76 to a prescribed value. In this example, the attenuator controller 74 sets that voltage by transmitting a prescribed constant, DC current through a known fixed resistance RES (e.g., one or more resistors) coupled to ground. A second current source 86 provides that current. Other embodiments may use other types of voltage sources and thus, discussion of the second current source 86 and resistance RES is by example only. In illustrative embodiments, the resistance RES is the same type as the resistor 70 in the unit cell attenuator 56. For example, both may be resistors having the same resistance.

Figure 8B:
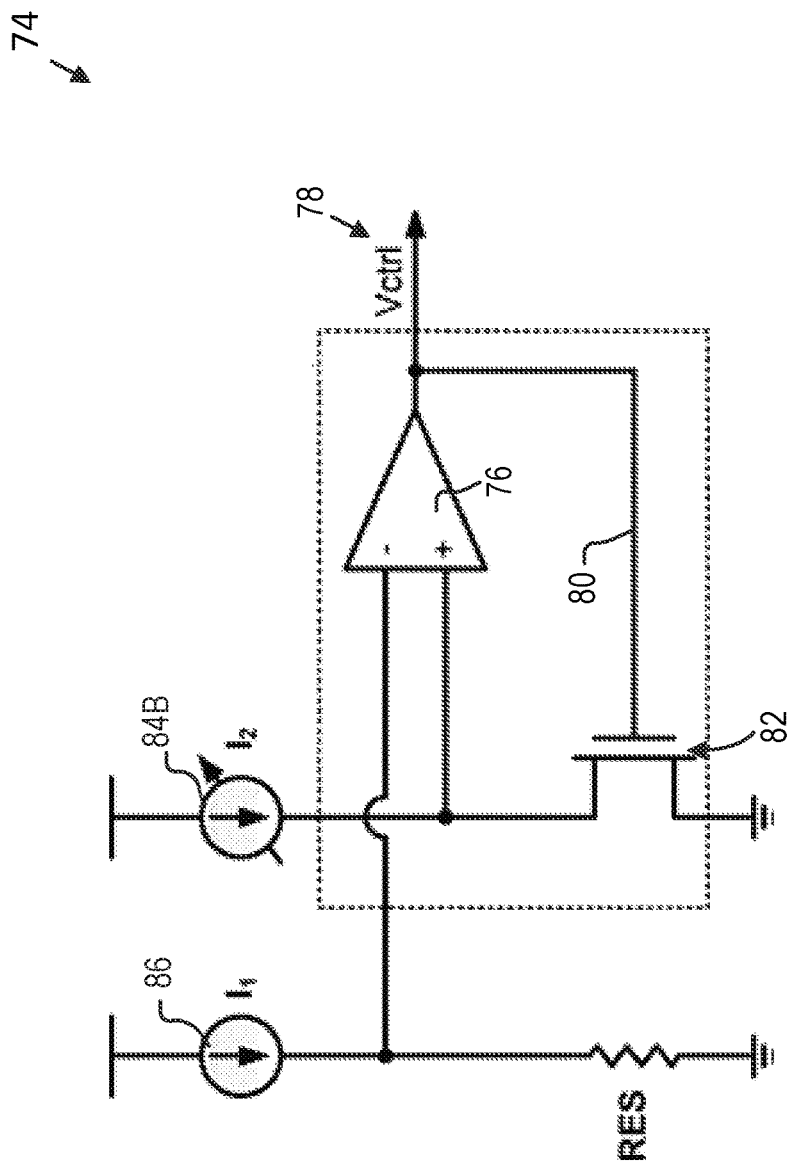

FIG. 8A, however, is a simplified version of the attenuator controller. FIG. 8B shows a more controllable version of the attenuator controller 74, in which a user or logic may more readily control the output voltage and on-resistance of the control MOSFET 82. Specifically, rather than having two constant current sources 84A and 86, the embodiment of FIG. 8B uses a controllable/variable current source 84B to control the current through the control MOSFET 82. The variable current therefore can be changed to directly change the output voltage of the op-amp 76 and the on-resistance of the control MOSFET 82. In doing so, the controller output can be switched through a range of voltages spanning from the noted maximum and minimum voltages. The two currents produced by the two current sources 84B and 86 can be related in any of a variety of ways. For example, the current through the control MOSFET 82 can be varied as a multiple of the current through the fixed resistance RES. Other embodiments may vary the current in other manners that are not necessarily multiples of the current through the fixed resistance RES. In either case, the on-resistance of the control MOSFET 82 varies as a function of the current to maintain the voltage at the positive input terminal of the op-amp 76 at a level that is substantially the same as, or close to, that at the negative input terminal of the op-amp 76. As discussed below, the feedback loop 80 facilitates that changing voltage.

Figure 9:
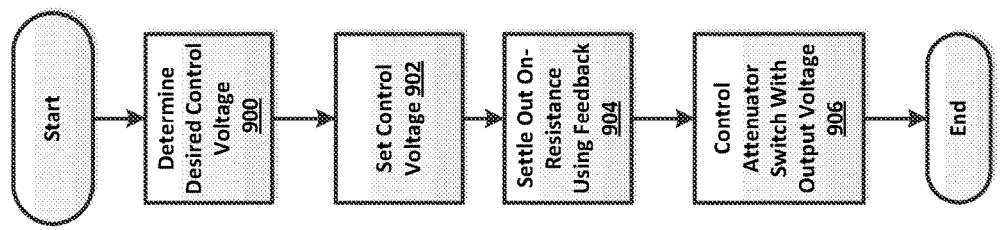
FIG. 9 shows a process used by the attenuator of FIG. 7 in accordance with illustrative embodiments of the invention.

FIG. 9 demonstrates operation of the attenuator controller 74 of FIG. 8B in accordance with illustrative embodiments of the invention. It should be noted that this process is substantially simplified, and some of the steps may be performed in a different order than that shown, or at the same time. Those skilled in the art therefore can modify the process as appropriate.

The process begins at step 900, in which logic or a user determines the desired voltage for the attenuator controller output 78 to direct to the attenuator switch 68 and/or 69 to which it is coupled. For example, the specific attenuator controller 74 may couple with just the first unit cell attenuator 56 of the series of attenuators 50 of FIG. 6, and each of the other unit cell attenuators 56 may have their own attenuator controllers 74. In preferred embodiments, however, the attenuator controller 74 couples with just one unit cell attenuator 56 and still provides a wide range of different attenuation values. This latter case is discussed further with reference to this process of FIG. 9.

Step 902 therefore sets the control voltage to this desired voltage. Throughout the process, the voltage at the negative input of the op-amp 76 preferably is a fixed amount. The current through the control MOSFET 82 also produces a voltage at the positive input of the op-amp 76. Step 904 therefore settles out the on-resistance of the control MOSFET using the feedback loop 80.

Specifically, if the current/on-resistance of the control MOSFET 82 is high enough to produce a voltage greater than that at the negative input terminal of the op-amp 76, then the op-amp output produces a high output voltage. This high output voltage is fed back to the gate of the control MOSFET 82, consequently reducing the on-resistance of the control MOSFET 82. Consequently, due to the constant current provided by the current source 84B and the constant voltage at the negative op-amp input, the reduced on-resistance of the control MOSFET 82 produces a correspondingly lower voltage at the positive input of the op-amp 76. If this new lower voltage is higher than but closer to the voltage at the negative op-amp input, then the output of the op-amp 76 reduces, causing the on-resistance of the control MOSFET 82 to decrease further. This feedback process continues until the on-resistance of the control MOSFET 82 reaches an equilibrium. This equilibrium may produce still a voltage at the op-amp output 78.

To change the output voltage at the op-amp output 78, logic or a user changes the current directed through the control MOSFET 82. For example, to increase the voltage, the first current source 84B may increase from equal to that produced by the second current source 86 to twice that of the second current source 86. Due to the nature of the op-amp 76 and the constant voltage at its negative input, the voltage at the positive input of the op-amp 76 strives to have a voltage that is equal to that produced by the resistance RES and second current source 86. To do that, due to ohms law, the on-resistance of the control MOSFET 82 reduces by half of its previous value to compensate for the doubling of the current. The output voltage therefore must increase a corresponding amount to reduce the on-resistance of the control MOSFET 82, thus changing the voltage at the output 78 to a higher value.

This same settling process also applies to the opposite situation when the current source 84B reduces its current, consequently causing the voltage at the output 78 to correspondingly reduce to equalize with the fixed voltage at the negative op-amp input. Note that the op-amp 76 is configured to ensure that the control MOSFET 82 remains on and thus, should provide a voltage that exceeds the threshold voltage of the control MOSFET 82. Thus, this minimal voltage (of this embodiment) effectively may be considered an offset voltage, which may be relatively small for high-gain op-amps.

Accordingly, the output voltage of the attenuator controller 74 is a function of the on-resistance of the control MOSFET 82 which, importantly, is a function of the constant voltage at the negative input of the op-amp 76. The on-resistances of the switches 68 and 69 of FIG. 7 therefore are a function of the output voltage produced by the attenuator controller 74. Specifically, as substantially identical transistors, the on-resistance of the switches 68 and 69 preferably is the same as, a scaled version of, or significantly close to, that of the control MOSFET 82 when receiving the same gate voltage.

Thus, the constant voltage at the negative input of the op-amp 76 essentially ensures that all of the on-resistances are consistent. Illustrative embodiments also work across different lots made using similar but different fabrication processes. For example, in a later manufactured lot, the current produced by the first current source 84B is tuned to produce a voltage that is substantially the same as that at the negative input of the op-amp 76. Thus, the output 78 of the op-amp 76 settles to an output voltage that ensures the desired on-resistance for the control MOSFET 82. In fact, this output voltage may be different on this later manufactured lot than the output voltage required for the same on-resistance of the earlier manufactured lot. Regardless, because this output voltage produces the desired on-resistance at the control MOSFET 82, it will produce the same desired on-resistance at the switches 68 and 69 of FIG. 7.

The process concludes at step 906 by controlling the switch to which is coupled (68/69) with the output voltage.

Active Electronically Steered System Assembly

FIG. 10 shows a process of forming the phased array 10A/AESA system 10 in accordance with illustrative embodiments of the invention. It should be noted that this process is substantially simplified from a longer process that normally would be used to form the AESA system 10. Accordingly, the process of forming the AESA system 10 is expected to have many steps, such as testing steps, soldering steps, or passivation steps, which those skilled in the art may use.

In addition, some of the steps may be performed in a different order than that shown, or at the same time. Those skilled in the art therefore can modify the process as appropriate. Moreover, as noted above and below, the discussed materials and structures are merely examples. Those skilled in the art can select the appropriate materials and structures depending upon the application and other constraints. Accordingly, discussion of specific materials and structures is not intended to limit all embodiments.

The process of FIG. 10 begins at step 1000, which forms the array of elements 18 on the substrate 16/printed circuit board 16. As noted above, the elements 18 preferably are formed from metal deposited onto the substrate 16 in a triangular lattice. This step also may form pads 28 and transmission lines 26 on the printed circuit board 16 to extend to the elements 18 (from the pads 28). As discussed below, these lines 26 electrically connect the integrated circuits 14 with the elements 18.

In preferred embodiments, the elements 18 are spaced apart from each other as a function of the wavelength of the signals expected to be transmitted and received by the AESA system 10. For example, the distances between the elements 18 may be spaced apart a distance equal to between 40-60 percent of the wavelength of the relevant signals. Some embodiments, however, may vary the spacing of the elements 18. See, for example, provisional U.S. Patent Application No. 62/376,442, filed on Aug. 18, 2016 and entitled, "Hybrid Laminated Phased Array," for further spacing and other details of similar embodiments. The disclosure of that provisional patent application (U.S. Patent Application No. 62/376,442) is incorporated herein, in its entirety, by reference.

Those skilled in the art can select the appropriate numbers of elements 18, based upon the application. Specifically, a given application may require a specified minimum equivalent isotropically radiated power ("EIRP") for transmitting signals. In addition, that same application may have a specified minimum G/T for receiving signals. Thus, step 1000 may form the array to have a minimum number of elements 18 to meet either or both the EIRP and the G/T requirements of the application. For example, after establishing the feed loss and the noise figure of the receive amplifier 40 of the vector receive arms 36, one skilled in the art can set the array size to a desired G/T. Of course, the phased array 10A may have more elements 18 beyond that minimum number.

Other embodiments may use other requirements for selecting the appropriate number of elements 18. Accordingly, discussion of the specific means for selecting the appropriate number of elements 18, and their spacing, is for descriptive purposes only and not intended to limit various embodiments of the invention.

At step 1002, the process mounts the integrated circuits 14 to the printed circuit board 16/substrate 16. To that end, as noted above, when using WLCSP integrated circuits 14, illustrative embodiments may use conventional flip-chip mounting processes. Such a process directly electrically connects the integrated circuits 14 to the elements 18 (step 1004). To that end, such embodiments may deposit solder paste (e.g., powdered solder and flux) on the pads 28 of the printed circuit board 16, and position the integrated circuits 14 on their respective board pads 28. Then, the printed circuit board 16 may be heated (e.g., using a reflow oven or process) to physically and electrically couple the pads 28 with the solder 30.

Some embodiments that do not use flip-chip mounted WLCSP integrated circuits 14, however, may require the additional step of step 1004 to electrically connect the integrated circuits 14 to the elements 18. For example, a wirebond operation may be required to solder wirebonds between the integrated circuits 14 and the elements 18.

The process concludes by adding the polarizer 20 (step 1006) and securing the radome 22 (step 1008) to the apparatus in a conventional manner.

Although the above discussion discloses various exemplary embodiments of the invention, it should be apparent that those skilled in the art can make various modifications that will achieve some of the advantages of the invention without departing from the true scope of the invention.

What is claimed is:

1. An attenuator circuit comprising:
   an input configured to receive an input signal;
   an output configured to transmit an output signal;
   a first attenuation path between the input and the output, the first attenuation path having a first active circuit device with a first on-resistance;
   a second attenuation path between the input and the output; and
   an attenuation control circuit configured to control attenuation through the first and second attenuation paths,
   the attenuation control circuit having a voltage control device and a second active circuit device with a second on-resistance,
   the attenuation control circuit having a control output coupled with the first active circuit device to direct a control output signal to the first active circuit device,
   the attenuation control circuit having a feedback loop coupled between the control output and the second active circuit device, the feedback loop being configured to direct the control output signal to the second active circuit device,
   the control output signal being a function of the second on-resistance,
   the second on-resistance being a function of the voltage control device,
   the first on-resistance being a function of the control output signal; and
   a switching arrangement configured to controllably direct the input signal to the first attenuation path, the second attenuation path, or both the first and second attenuation paths at the same time in response to the attenuation control circuit changing the second on-resistance of the second active control device.

2. The attenuator circuit as defined by claim 1 wherein the voltage control device includes a resistance and a current source directing a controlling current through the resistance.

3. The attenuator circuit as defined by claim 1 wherein the attenuation control circuit has a variable signal generator configured to control an active circuit device signal across the second active circuit device, the control output signal being a function of the active circuit device signal.

4. The attenuator circuit as defined by claim 3 wherein the variable signal generator comprises a variable current generator and the active circuit device signal comprises a current.

5. The attenuator circuit as defined by claim 3 further comprising a digital input coupled with the variable signal generator.

6. The attenuator circuit as defined by claim 1 wherein the attenuation control circuit comprises an operational amplifier having an op-amp output and first and second op-amp inputs, the op-amp output comprising the control output, the voltage control device being coupled with the first op-amp input, the second active circuit device being coupled with the second op-amp input.

7. The attenuator circuit as defined by claim 1 wherein the second active circuit device includes a gate terminal, the feedback loop being coupled with the gate terminal of the second active circuit device.

8. The attenuator circuit as defined by claim 1 further comprising a third active circuit device having a third on-resistance, the attenuator circuit also having an additional attenuation control circuit configured to control attenuation through the first and second attenuation paths, the additional attenuation control circuit having an additional voltage control device and a fourth active circuit device with a fourth on-resistance, the additional attenuation control circuit having an additional control output coupled with the third active circuit device to direct an additional control output signal to the third active circuit device, the additional attenuation control circuit having an additional feedback loop coupled between the additional control output and the fourth active circuit device, the additional feedback loop being configured to direct the additional control output signal to the fourth active circuit device, the additional control output signal being a function of the fourth on-resistance, the fourth on-resistance being a function of the additional voltage control device, the third on-resistance being a function of the additional control output signal.

9. The attenuator circuit as defined by claim 1 further comprising a phased array beam steering circuit, the attenuation control circuit being part of the phased array beam steering circuit.

10. A circuit for attenuating a signal, the circuit comprising:
   an input configured to receive an input signal;
   an output configured to transmit an output signal;
   a first attenuation path between the input and the output;
   a second attenuation path between the input and the output, the first attenuation path having a first active circuit device;
   an operational amplifier having a first op-amp input, a second op-amp input, and an op-amp output;
   a voltage control device coupled with the first op-amp input;
   a second active circuit device having a first active terminal and a second active terminal, the second op-amp input coupled to the first active terminal of the second active circuit device,
   a feedback loop coupled between the op-amp output and the second active terminal of the second active circuit device; and
   the op-amp output being coupled with the first active circuit device,
   a switching arrangement configured to controllably direct the input signal to the first attenuation path, the second attenuation path, or both the first and second attenuation paths at the same time in response to a second on-resistance of the second active control device being changed.

11. The circuit as defined by claim 10 wherein the voltage control device comprises a resistance and a current source directing current through the resistance.

12. The circuit as defined by claim 10 wherein the first active circuit device has a first on-resistance, the second active circuit device has a second on-resistance, the op-amp output configured to produce a control output signal, the control output signal being a function of the second on-resistance, the second on-resistance being a function of the controlling resistance, the first on-resistance being a function of the control output signal.

13. The circuit as defined by claim 10 wherein the voltage control device comprises a variable signal generator configured to control an active circuit device signal across the second active circuit device, the op-amp output being configured to produce a control output signal as a function of the active control signal controlled by the variable signal generator.

14. The circuit as defined by claim 13 wherein the variable signal generator comprises a variable current generator and the active circuit device signal comprises a current.

15. A method of controlling an attenuator having an input configured to receive an input signal, an output configured to transmit an output signal, a first attenuation path between the input and the output, and a second attenuation path between the input and the output, the first attenuation path having a first active circuit device with a first on-resistance, the method comprising:
   providing an operational amplifier having a first op-amp input, a second op-amp input, and an op-amp output;
   driving a control voltage from a voltage control device to the first op-amp input;
   controlling the voltage at the second op-amp input to cause the op-amp output to produce a prescribed control output signal, said controlling comprising feeding back the control output signal toward the second op-amp input via a second active circuit device having a second on-resistance,
   the control output signal being a function of the second on-resistance,
   the second on-resistance being a function of the control voltage,
   the first on-resistance being a function of the control output signal; and
   directing the input signal to the first attenuation path, the second attenuation path, or both the first and second attenuation paths at the same time by changing the second on-resistance of the second active control device.

16. The method as defined by claim 15 wherein said controlling the voltage at the second op-amp input comprises driving an active circuit device signal across the second active circuit device, the control output signal being a function of the active circuit device signal.

17. The method as defined by claim 16 wherein the active circuit device signal comprises a current.

18. The method as defined by claim 16 further comprising varying the active circuit device signal across the second active device.

19. The method as defined by claim 16 wherein the first active circuit device comprises a field effect transistor.

* * * * *